US010468548B2

(12) United States Patent
Sachet et al.

(10) Patent No.: US 10,468,548 B2
(45) Date of Patent: Nov. 5, 2019

(54) OXIDE HETEROJUNCTION FOR DETECTION OF INFRARED RADIATION

(71) Applicant: North Carolina State University, Raleigh, NC (US)

(72) Inventors: Edward Sachet, Raleigh, NC (US); Jon-Paul Maria, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 15/142,494

(22) Filed: Apr. 29, 2016

(65) Prior Publication Data

US 2016/0322530 A1    Nov. 3, 2016

Related U.S. Application Data

(60) Provisional application No. 62/155,802, filed on May 1, 2015.

(51) Int. Cl.
*H01L 31/108* (2006.01)
*H01L 31/109* (2006.01)
(Continued)

(52) U.S. Cl.
CPC ...... *H01L 31/109* (2013.01); *H01L 31/02363* (2013.01); *H01L 31/02963* (2013.01);
(Continued)

(58) Field of Classification Search
CPC ............... B01J 2523/00; B01J 2523/24; B01J 2523/3706; B01J 2523/47; B01J 2523/845;
(Continued)

(56) References Cited

U.S. PATENT DOCUMENTS 6,262,418 B1    7/2001    Hashimoto et al.
6,563,185 B2    5/2003    Moddel et al.
(Continued)

OTHER PUBLICATIONS

Atwater, H.A. & Polman, A., Nat. Mater., 9, 205-213 (2010).
(Continued)

*Primary Examiner* — Edward Chin
(74) *Attorney, Agent, or Firm* — Michael Best & Friedrich LLP (57) ABSTRACT

A detector that includes an all-oxide, Schottky-type heterojunction. The "metal" side of the heterojunction is formed, for example, from a dysprosium ("Dy") doped cadmium oxide ("CdO") (i.e., CdO:Dy). The semiconductor side of the heterojunction is formed, for example, from cadmium magnesium oxide ("CdMgO"). On the metal side of the junction, "hot" electrons are created through the excitation of surface plasmon polaritons by infrared radiation. The hot electrons are able to cross the Schottky-type barrier of the heterojunction into the conduction band of the semiconductor where they can be detected. The working wavelength of infrared radiation that is being detected can be adjusted or tuned by modifying the Dy content of Dy-doped CdO. The height of the Schottky-type barrier can also be adjusted by modifying the composition of CdMgO, which allows for the optimization of the Schottky-type barrier height for a given working wavelength.

19 Claims, 11 Drawing Sheets

(51) Int. Cl.
*H01L 31/0336* (2006.01)
*H01L 31/0236* (2006.01)
*H01L 31/0296* (2006.01)

(52) U.S. Cl.
CPC .... *H01L 31/02966* (2013.01); *H01L 31/0336* (2013.01); *H01L 31/108* (2013.01); *Y02E 10/50* (2013.01)

(58) Field of Classification Search
CPC ............... B01J 2523/31; B01J 2523/72; B01J 2523/847; B01J 2523/55; B01J 2523/821; B01J 23/002; B01J 23/22; B01J 23/34
USPC ......................................... 257/E27.123, 461
See application file for complete search history.

(56) References Cited

U.S. PATENT DOCUMENTS

| | | | |
|---|---|---|---|
| 9,196,766 B1* | 11/2015 | Egerton | G01J 5/20 |
| 2010/0127255 A1* | 5/2010 | Allen | H01L 29/22 |
| | | | 257/43 |
| 2012/0139074 A1* | 6/2012 | Abe | H01L 31/105 |
| | | | 257/461 |
| 2014/0060643 A1* | 3/2014 | Martin | B01J 37/349 |
| | | | 136/256 |
| 2016/0211475 A1* | 7/2016 | Chaki Roy | H01L 51/4206 |
| 2017/0084399 A1* | 3/2017 | Vak | H01L 51/0004 |

OTHER PUBLICATIONS

Boltasseva, A., MRS Bull. (2014) doi:10.1557/mrs.2014.91.
Burbano et al., Sources of Conductivity and Doping Limits in CdO from Hybrid Density Functional Theory, J. Am. Chem. Soc., 133, 15065-15072 (2011).
Cerruti et al., J. Phys. Appl. Phys., 40, 4212-4221 (2007).
Global Infrared Sensors Market Analysis and Forecast (2014-2019).
Knight et al., Science, 332, 702-04 (2011).
Losego et al., J. Appl. Phys., 106, 024903 (2009).
Manjavacas et al., ACS Nano, 8, 7630-7638 (2014).
Markets and Markets Report SE 2275.
Room temperature Vs. LN2-Cooled Detectors Infrared Microscopy Cost/Performance Analysis, Thermo Scientific, Technical Note 51513.
Sachet et al., J. P. Appl. Phys. Lett., 102, 051111-051111-4 (2013).
Sachet et al., Nat. Mater. Advance online publication (2015).
Sobhani et al., Nat. Commun., 4, 1643 (2013).
Aspnes, "Plasmonics and effective-medium theories," Thin Solid Films 519, 2571-2574 (2011).
Born et al., Principles of Optics: Electromagnetic Theory of Propagation, Interference and Diffraction of Light. (CUP Archive, 2000).
Brongersma et al., "Plasmon-Induced hot carrier science and technology." Nat. Nanotechnol. 10. 2015, 25-34.
Campione et al., "Epsilon-Near-Zero Modes for Tailored Light-Matter Interaction," Phys. Rev. Appl. 4, 2015, 44011.
Campione et al.. "Theory of epsilon-near-zero modes in ultrathin films." Phys. Rev. B 91, 2015, 121408.
Knight et al., "Embedding Plasmonic Nanostructure Diodes Enhances Hot Electron Emission," Nano Lett. 13, 2013, 1687-1692.
Rhodes et al., "Investigation of hexadecanethiol self-assembled monolayers on cadmium tin oxide thin films," Thin Solid Films 516, 2008. 1838-1842.
Sarid et al., Modern Introduction to Surface Plasmons: Theory, Mathematica Modeling, and Applications. (Cambridge University Press, 2010).
Sundararaman et al., "Theoretical predictions for hot-carrier generation from surface plasmon decay," Nat. Commun. 5, 2014, 8 pages.
United States Patent Office Action for U.S. Appl. No. 15/644,216 dated Feb. 23, 2018 (14 pages).
United States Patent Office Notice of Allowance for U.S. Appl. No. 15/644,216 dated Aug. 8, 2018 (5 pages).

* cited by examiner

OXIDE HETEROJUNCTION FOR DETECTION OF INFRARED RADIATION

RELATED APPLICATIONS

This patent application claims priority from provisional U.S. Patent Application No. 62/155,802 filed May 1, 2015, entitled, "OXIDE HETEROJUNCTION FOR DETECTION OF INFRARED RADIATION," the disclosure of which is incorporated herein, in its entirety, by reference.

STATEMENT REGARDING FEDERALLY SPONSORED RESEARCH OR DEVELOPMENT

This disclosure was made with government support under CHE 1112017 awarded by the National Science foundation. The government has certain rights in the disclosure.

BACKGROUND

This disclosure relates to detecting infrared radiation.

SUMMARY

This disclosure provides a detector (e.g., an infrared radiation detector) including a semiconductor heterostructure that enables the injection of hot carriers (e.g., hot electrons) into a wide bandgap semiconductor upon illumination by infrared radiation (i.e., infrared photons). The infrared detector is operable at ambient room temperatures (e.g., between 50° F. and 90° F.) and does not require cooling. In some embodiments, however, the infrared detector is cooled, which can allow for still better performance by the detector. Nevertheless, because the infrared detector is operable and effective without cooling, the infrared detector allows for portability (i.e., lower weight) and provides the desirable performance of cooled infrared detectors at a substantially lower-cost. In various embodiments, the infrared detector is also operable at ambient temperatures outside of room temperature (e.g., between 0 and 300K).

In one embodiment, the disclosure provides a detector that includes an all-oxide, Schottky-type heterojunction (i.e., a junction between a "metal" and a semiconductor). The "metal" side of the heterojunction is formed, for example, from a dysprosium ("Dy") doped cadmium oxide ("CdO") (i.e., CdO:Dy). The semiconductor side of the heterojunction is formed, for example, from cadmium magnesium oxide ("CdMgO"). On the metal side of the junction, "hot" electrons are created through the excitation of SPPs by infrared radiation. The hot electrons are able to cross the Schottky-type barrier of the heterojunction into the conduction band of the semiconductor where they can be detected. The working wavelength of infrared radiation that is being detected can be adjusted or tuned by modifying the Dy content of Dy-doped CdO. The height of the Schottky-type barrier can also be adjusted by modifying the composition of CdMgO, which allows for the optimization of the Schottky-type barrier height for a given working wavelength. In some embodiments, this functionality is realized in a single rocksalt, heteroepitaxial stack that facilitates high crystal and interface quality, and which are well-suited for the production of integrated circuits, optoelectronics, etc.

In another embodiment, the disclosure provides a detector for detecting infrared radiation. The detector includes a first portion, a second portion, and a junction. The first portion is formed of a conducting metal oxide. The second portion is formed of a semiconducting material. The junction is disposed between the first portion and the second portion. The junction forms a Schottky-type barrier. Infrared radiation incident upon the first portion of the detector is operable to create hot carriers that are injected from a conduction band of the conducting metal oxide to a conduction band of the semiconducting material.

In another embodiment, the disclosure provides a detector for detecting infrared radiation. The detector includes a first portion, a second portion, and a heterojunction. The first portion is formed of a cadmium oxide doped with dysprosium. The second portion is formed of a semiconducting material. The heterojunction is disposed between the first portion and the second portion. The heterojunction forms a Schottky-type barrier. Infrared radiation incident upon the first portion of the detector is operable to create hot carriers that are injected from a conduction band of the cadmium oxide to a conduction band of the semiconducting material.

Other aspects of the disclosure will become apparent by consideration of the detailed description and accompanying drawings.

DETAILED DESCRIPTION

Before any embodiments of the disclosure are explained in detail, it is to be understood that the disclosure is not limited in its application to the details of the configuration and arrangement of components set forth in the following description or illustrated in the accompanying drawings. The disclosure is capable of other embodiments and of being practiced or of being carried out in various ways. Also, it is to be understood that the phraseology and terminology used herein are for the purpose of description and should not be regarded as limiting. The use of "including," "comprising," or "having" and variations thereof herein are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments of the disclosure may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the disclosure may be implemented in software (e.g., stored on non-transitory computer-readable medium) executable by one or more electronic processing units, such as a microprocessor and/or application specific integrated circuits ("ASICs"). As such, it should be noted that a plurality of hardware and software based devices, as well as a plurality of different structural components may be utilized to implement the disclosure. For example, "servers" and "computing devices" described in the specification can include one or more electronic processing units, one or more computer-readable medium modules, one or more input/output interfaces, and various connections (e.g., a system bus) connecting the components.

The detection of infrared radiation is utilized in a wide variety of applications, such as thermography, night vision technologies, energy harvesting, surveillance, heat tracking, seeing through clouds and dust, telecommunications, etc. The detection of infrared radiation is typically accomplished using narrow bandgap semiconductor compounds such as mercury cadmium telluride ("HgCdTe"). Such ternary compounds have compositionally tunable bandgaps that allow for the detection of infrared radiation in both the mid-wave infrared window ("MWIR") (i.e., from 3 μm-5 μm) and the long-wave infrared window ("LWIR") (i.e., from 8 μm-12 μm).

High performance solid-state infrared detectors based on semiconductors such as HgCdTe, as well as indium antimonide ("InSb"), or indium arsenide ("InAs") must be cooled to cryogenic temperatures (i.e., between 4K-100K) in order to operate effectively. The narrow bandgaps for electron-hole pair creation by incident infrared photons in these detectors (e.g., 155 meV-413 meV for MWIR and 83 meV-155 meV for LWIR) necessitate the cooling of the detectors below ambient temperatures. At room temperature (e.g., between 60° F. and 80° F.), thermal energy causes the thermal excitation of electrons, which results in thermal noise. Without sufficient cooling, the detectors are blinded by the thermal noise and, as a result, do not operate effectively as infrared detectors. The cooling of such detectors is typically achieved by a liquid cryogen, such as liquid nitrogen or helium, or rotary Stirling engines. Each cooling option adds considerable bulk and cost to the operation of the detectors. For example, the cost for scientific (e.g., laboratory) infrared detectors that require liquid nitrogen cooling is estimated to be approximately $7,000 per year.

There are uncooled infrared detection technologies (e.g., bolometers, thermopile arrays, etc.), but such technologies are significantly less sensitive, slower, and have lower resolution than cooled semiconductor detectors. Low-cost, room temperature infrared detectors that can match the performance of cooled semiconductor detectors would have a significant impact on the use of infrared detection in individual, commercial, and defense applications.

Alternative detection techniques can utilize, for example, the interactions between light and matter in infrared and near-infrared portions of the electromagnetic spectrum to detect infrared or near-infrared radiation at ambient room temperatures. These detection techniques make use of a phenomenon known as surface plasmon resonance. Surface plasmon resonance is the resonant oscillation of conductive band electrons in a material stimulated by light (e.g., near-infrared radiation). The presence of oscillations or plasmon polaritons, such as, but not limited to surface plasmon polaritons ("SPPs") from plasmon resonance enhances the interactions between light and matter, and enable "hot" carrier injection of carriers (e.g., electrons) from one material to another.

Figure 1A:
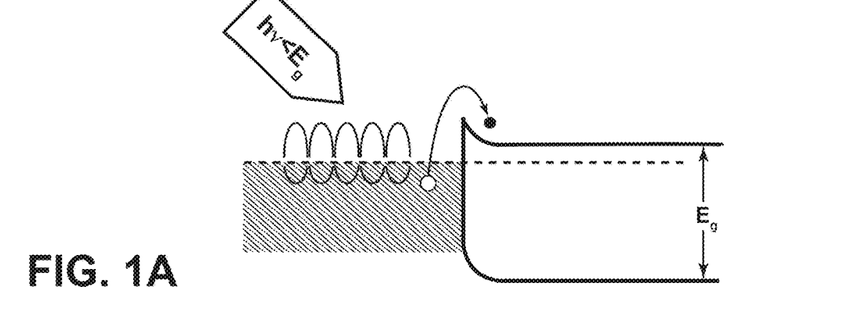
FIG. 1A illustrates plasmonic injection where incoming light couples to a surface plasmon in a conduction layer of a material.

FIG. 1A illustrates the concept of plasmonic hot carrier injection. Plasmonic hot carrier injection is the mechanism by which high-energy electrons can be promoted into the conduction band of a semiconductor. For example, incident infrared radiation causes electrons in the metal side of the heterojunction (i.e., the left side of FIG. 1A) to oscillate due to surface plasmon resonance. The decay of the oscillation (i.e., the polariton) imparts energy to the electrons. Some electrons gain sufficient kinetic energy to jump into the adjacent semiconductor (i.e., the right side of FIG. 1A). The metal-semiconductor junction can have a large bandgap and an energy barrier to conduction electrons between the two materials (which differs from the absolute bandgap). If the bandgap is greater than several electron volts ("eV"), the metal-semiconductor junction will be immune to thermal noise at temperatures below $10^3$K.

Figure 1B:
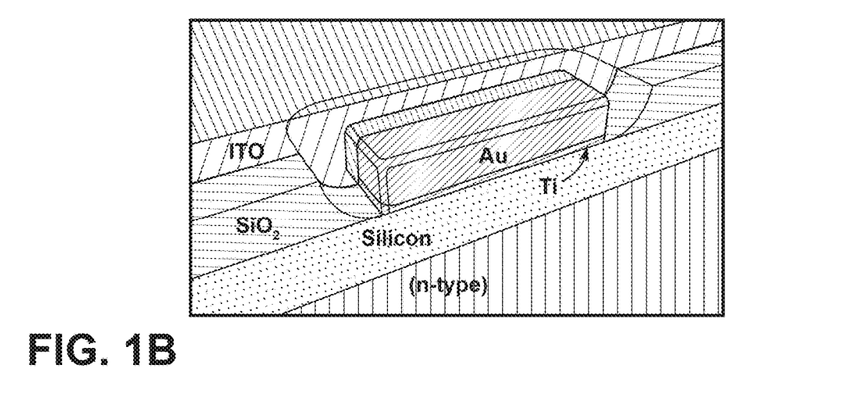
FIG. 1B is a schematic illustration of a noble metal-semiconductor heterojunction.
Figure 1C:
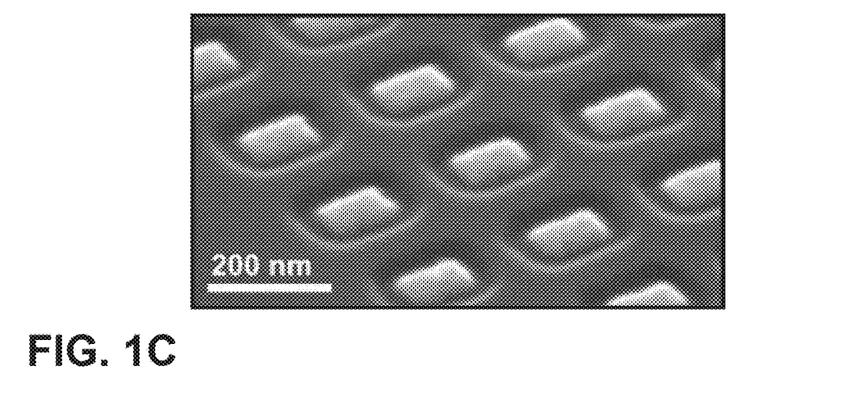
FIG. 1C illustrates a near-infrared detector.

However, these light-matter interactions have failed to produce effective and low-cost infrared detectors for two primary reasons: (1) plasmons in metals are lossy, which arises from interband and intraband transitions, low electron mobility, and a small electron mean free path; and (2) research into infrared plasmonic technologies utilizes noble metals (e.g., gold ["Au"]). Noble metal nanostructures are expensive and laborious to produce. FIGS. 1B and 1C illustrate such a detector including a metal-semiconductor junction that utilizes Au. A nano-patterned Au layer couples with near-infrared radiation, which excites plasmon oscillations and injects electrons into the silicon ("Si") semiconductor where they can be collected. Material property limitations, however, reduce the efficiency of such a junction for detecting infrared radiation to values of approximately 0.2%. With respect to this specific detector implementation, the material property limitations include: (1) the infrared-Au interactions are based on metal-plasmon mechanisms which are fundamentally lossy; (2) the mean free path of electrons in Au are short (e.g., approximately 35 nanometers ["nm"]), thus, only hot electrons generated very close to the metal-semiconductor junction will be collected; and (3) it is difficult to make a low-barrier height Schottky contact to lightly-doped Si and smoothly vary the barrier height for the detection of a range of energies.

Detectors can also be made using a conducting metal oxide, rather than a noble metal such as Au. Unlike noble metals, conducting metal oxides, such as indium tin oxide ("ITO"), are naturally suited for infrared plasmonics. Carrier concentration (or density) values for such metal oxides are tunable (e.g., between $10^{18}$/cc and $10^{21}$/cc) and can be configured to resonate with the infrared portions of the electromagnetic spectrum that are of most interest (i.e., MWIR and LWIR). The conducting metal oxides are, in many instances, transparent to visible light, and the plasmon oscillations are very efficient. However, the significant limiting factor associated with prior conducting metal oxides (e.g., ITO) is low carrier mobility. Low mobility is particularly problematic for conducting metal oxides with carrier densities greater than $10^{19}$/cc.

As such, an improved detector that includes a heterojunction formed from a conducting metal oxide and a semiconductor that has efficient plasmon oscillations and high mobility would allow for the creation of effective and low-cost, room temperature infrared detectors.

The disclosure described herein is related to a detector for detecting infrared radiation. The detector includes a heterostructure having a heterojunction that forms a Schottky-type barrier. The heterojunction is an all-oxide, Schottky-type heterojunction (i.e., a junction between a "metal" material and a semiconductor material). The "metal" side of the heterojunction is formed from conducting metal oxide, such as a cadmium oxide doped with a metal having a valence state of $^+3$ (for example, dysprosium ("Dy"), aluminum ("Al"), Yttrium ("Y"), indium ("In"), gallium ("Ga"), tin ("Sn"), and the lanthanide series). For example, in some embodiments, the conducting metal oxide is Dy doped cadmium oxide ("CdO") (i.e., CdO:Dy). The semiconductor side of the heterojunction is formed, for example, from cadmium magnesium oxide ("CdMgO"). The detector can be monolithically integrated and tunable for infrared detection at wavelengths in both the mid-wave infrared window ("MWIR") (i.e., from 3 μm-5 μm) and the long-wave window ("LWIR") (i.e., from 8 μm-12 μm), as well as any other wavelength of interest between approximately 1.5 μm and 12 μm. Surface plasmon resonance causes carriers (e.g., electrons) on the "metal" side of the heterojunction to be excited. When the carriers gain sufficient kinetic energy to overcome the barrier height between the metal side and the semiconductor side of the heterojunction, the carriers are considered "hot" and are injected from a conduction band of the metal side of the heterojunction to a conduction band of the semiconductor side of the heterojunction. After the carriers are injected into the semiconductor side of the heterojunction, the electrons can be detected as current. Detectors according to embodiments of the disclosure can be utilized in applications such as mobile devices (e.g., mobile phones, cameras, tablet computers, etc.), automobiles, thermal imaging devices (e.g., replacing bolometers), etc.

Figure 2:
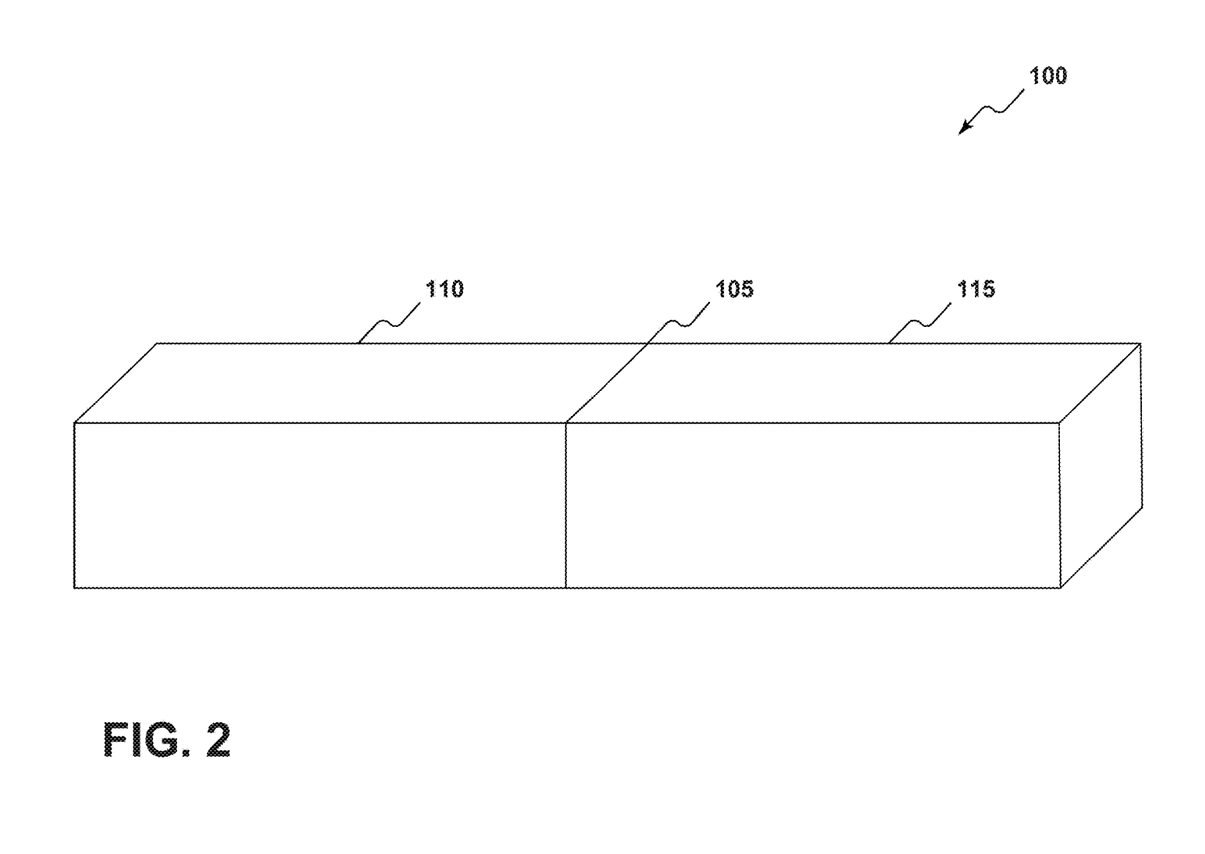
FIG. 2 illustrates a detector according to an embodiment of the disclosure.

FIG. 2 illustrates a detector 100 including a heterojunction 105. The heterojunction 105 includes a "metal" side 110 and a semiconductor side 115. The heterojunction 105 creates a Schottky-type barrier. In some embodiments, the heterojunction 105 is an all-oxide heterojunction (i.e., both sides of the junction are formed of oxide materials). For example, the metal side 110 of the heterojunction 105 can be formed from a conducting metal oxide and the semiconductor side 115 is formed from a semiconducting oxide.

Figure 3A:
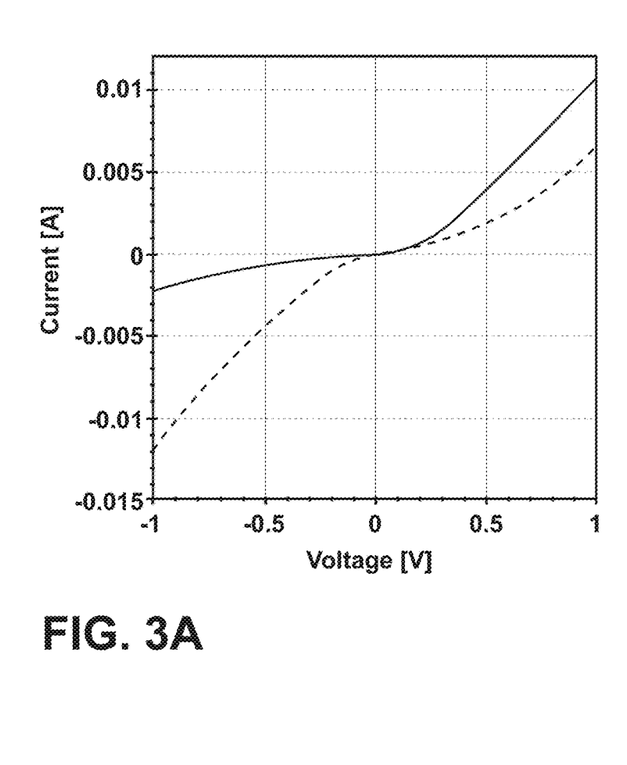
FIG. 3A illustrates a voltage-current characteristic of a heterojunction according to an embodiment of the disclosure.
Figure 3B:
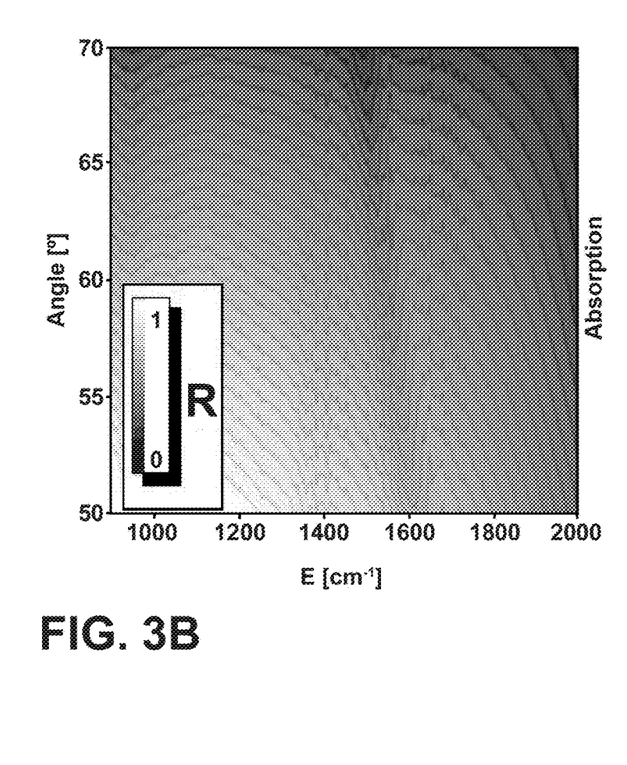
FIG. 3B is a reflectivity map for a grating fabricated on a heterojunction according to an embodiment of the disclosure.

An all oxide heterojunction for the detection of infrared radiation can be formed using a variety of materials, as long as the heterojunction operates in a manner similar to a Schottky-type barrier. In another embodiment, CdO can be used as the metal side 110 of the heterojunction 105. Gallium nitride ("GaN") can be used as the semiconductor side 115 of the heterojunction 105. The CdO—GaN heterojunction creates a Schottky-type barrier with a barrier height of less than about 0.5 eV. FIG. 3A illustrates the transport properties and the rectifying behavior at the CdO—GaN junction that is relied upon for hot carrier injection. The CdO—GaN heterojunction is tested to ensure that MWIR radiation generates SPPs, and that hot carriers are subsequently injected into the GaN layer of the heterojunction. In some embodiments, the efficiency of the heterojunction is tested using a MWIR quantum cascade laser. FIG. 3B illustrates a reflectivity map of a grating that illustrates such coupling. Photocurrents produced with the CdO—GaN heterojunction under infrared radiation illumination were measured and are reproducible (see FIG. 3A). The measurement results illustrated in FIGS. 3A and 3B were produced using an inefficient grating, an un-optimized heterojunction, a dim light source, and unshielded electrical testing. In some embodiments, by tuning growth parameters, a CdO—GaN heterojunction can be produced that achieves ideal diode characteristics. The quality of the diode created by the CdO—GaN heterojunction governs the diode's leakage current, which directly translates to measurement noise.

In another embodiment, GaN can be replaced with a two-dimensional semiconducting material, such as molybdenum disulfide ("MoS$_2$"). Two-dimensional semiconducting materials are very sensitive to small changes in carrier concentration. A 1 μm thick semiconductor (see FIG. 6B) can be replaced with a 1 nm thick sheet of MoS$_2$ and still achieve similar electron injection. The resistance parallel to the substrate drops by at least 1000× in the two-dimensional sheet of MoS$_2$ because it is 1000 times thinner than the 1 μm thick semiconductor.

As another illustrative example, the metal part 110 of the heterojunction 105 is formed from a degenerately-doped cadmium oxide ("CdO") (e.g., using dysprosium as an n-type dopant [CdO:Dy]). The semiconductor side 115 of the heterojunction 105 is formed from a solid solution of CdO and Magnesium Oxide ("MgO"). The solid solution of CdO and MgO ("CdMgO") has the same rocksalt crystal structure as CdO. This congruence in structure allows for heteroepitaxial growth of the detector and produces excellent interface quality between the metal and semiconductor portions of the heterojunction 105.

The oxides used in the detector 100 are wide bandgap oxides. The oxide in the semiconductor side 115 of the detector 100 has a bandgap that is larger than the thermal energy of electrons at room temperature (i.e., Boltzmann constant multiplied by temperature ["$k_BT$"]). Similarly, the height of the Schottky-type barrier formed between the metal side 110 and the semiconductor side 115 of the heterojunction 105 is larger than the thermal energy of electrons at room temperature. These properties of the detector 100 increase the resistance of the detector 100 to thermal noise at ambient room temperatures.

Figure 4:
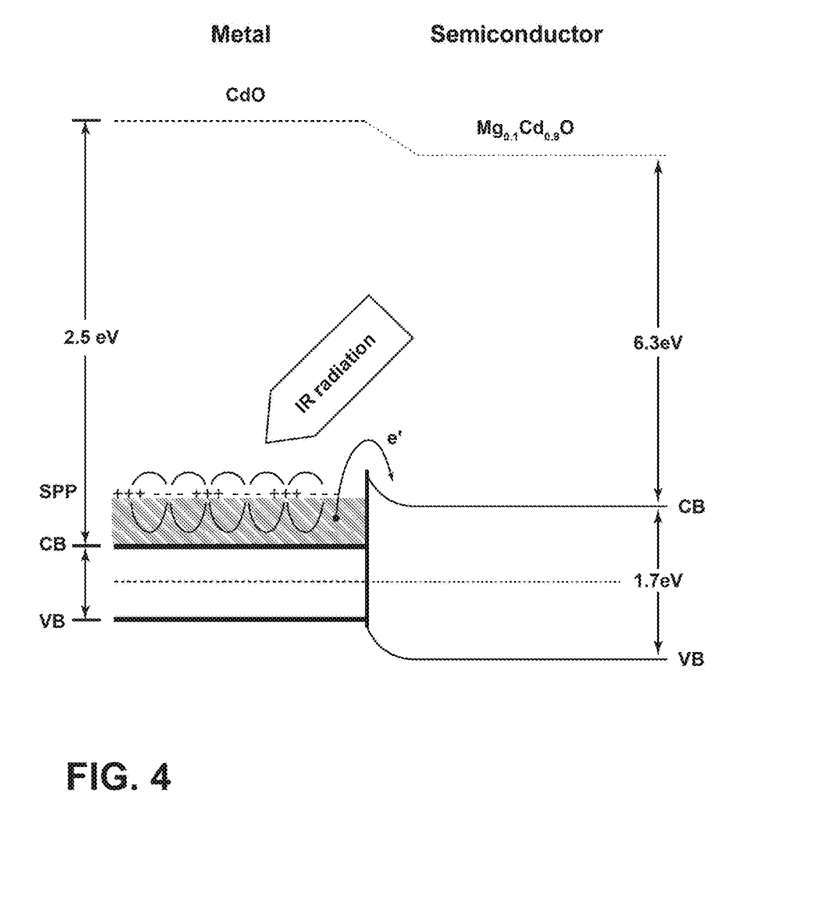
FIG. 4 illustrates the creation of "hot" electrons that are injected into a semiconductor layer of a heterojunction.

FIG. 4 illustrates the working principle of the disclosure. Incoming infrared photons couple to surface plasmon polaritons ("SPPs") that are created on the metal side 110 of the heterojunction (i.e., resonant oscillations of conduction band electrons resulting from surface plasmon resonance on the metal side 110 of the heterojunction). The SPPs can increase the kinetic energy of electrons to create "hot" electrons on the metal side 110 of the heterojunction 105. For example, when infrared radiation is incident upon the metal side 110 of the heterojunction 105, conduction band electrons begin to oscillate and, upon decay, they produce hot electrons. Hot electrons in the conduction band of the metal side 110 having sufficient kinetic energy to cross the Schottky-type barrier are injected into the conduction band of the semiconductor side 115 of the heterojunction 105. Once in the conduction band of the semiconductor, the electrons can be extracted with a voltage potential and detected as current. The result is a direct conversion of incoming infrared photons to electrical signals.

However, creating low-loss SPPs in the infrared portion of the electromagnetic spectrum is a significant challenge. For example, materials such as indium tin oxide ["ITO"], aluminum-doped zinc oxide ["ZnO:Al"], or gallium-doped zinc oxide ["ZnO:Ga"] exhibit significant losses when coupling to, and potentially detecting infrared radiation. These materials are particularly ineffective when used for wavelengths of greater than 5 μm. However, the metal side 110 of the detector 100 (e.g., formed from the CdO:Dy metal oxide) can be used to support SPPs over a wide energy range (e.g., between approximately 1.5 μm-12 μm). The losses experienced by the CdO:Dy metal oxide are about an order of magnitude lower than those of ITO, ZnO:Al, and ZnO:Ga.

Materials such as CdO:Dy have high electron mobilities. The high mobility of CdO:Dy enables the creation of low-loss and high-quality SPPs and improves the ability of the detector 100 to convert infrared radiation into an electrical signal at room temperature. In some embodiments, molecular beam epitaxial growth techniques allow for high electron mobility (e.g., greater than 400 $cm^2/V \cdot S$) in CdO:Dy.

Figure 5:
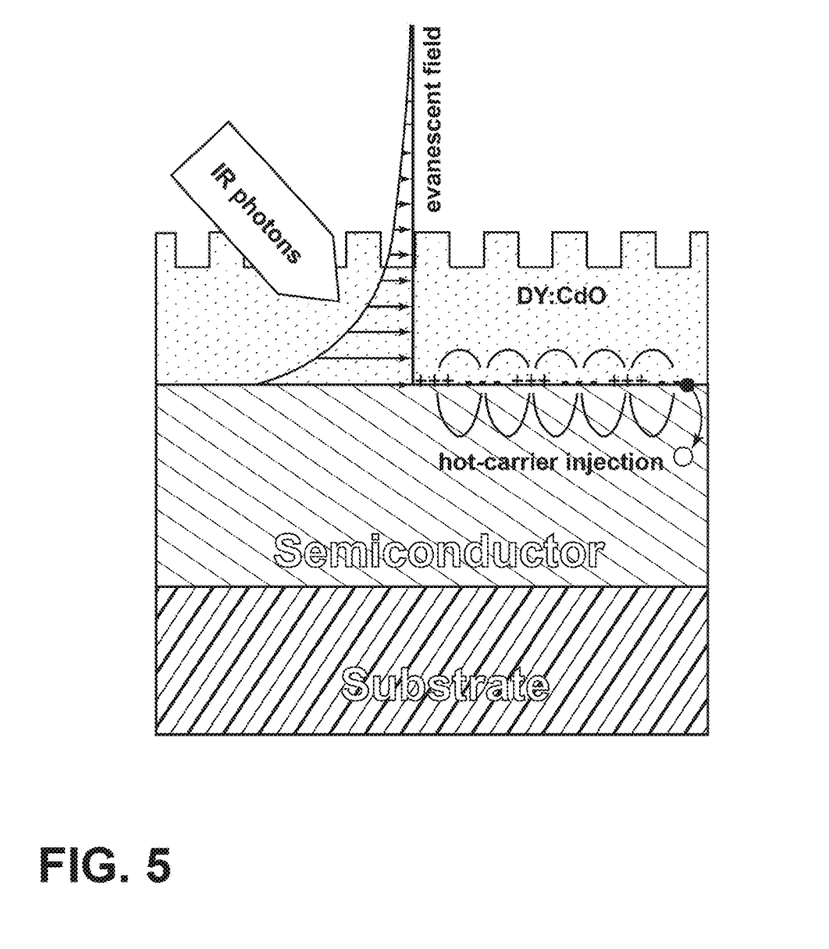
FIG. 5 illustrates a physical structure for a heterojunction according to an embodiment of the disclosure.

FIG. 5 illustrates the physical structure of the heterojunction 105 according to an embodiment of the disclosure. Incoming infrared radiation couples through a patterned surface to create SPPs at the CdO:Dy-semiconductor interface. The hot carriers resulting from the SPPs are injected into the semiconducting layer of the heterojunction. A CdO:Dy-semiconductor heterostructure has advantages over noble metal-semiconductor heterostructures. For example, CdO has a very narrow density-of-states ("DOS") in the conduction band. This naturally skews the hot electron populations to higher average energies on a per-photon basis. Compared to noble metals, this means more electrons are injected into the semiconductor layer, signals are greater in magnitude, and the distance from the noise floor of a detector is increased. Additionally, CdO does not require a patterned interface as is required for noble metals. As a result, the entire planar surface of the CdO participates to signal collection (i.e., infrared detection). With reference to the structures shown in FIG. 1C, there is a significant spectator area that is wasted between the metal areas. These spectator areas do not participate in signal collection (e.g., infrared detection). In some embodiments, prism coupling from the back side of a wafer (e.g., a Kretschmann configuration) can be used instead of a grating coupler fabricated on top of CdO (as is shown in FIG. 5). Such a coupling technique allows significantly more light to be coupled into the plasmon mode of CdO:Dy, which promotes a higher level of hot carrier generation and injection.

Figure 6A:
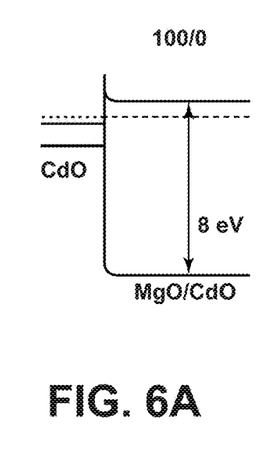
FIGS. 6A, 6B, 6C, 6D, and 6E illustrate the tunability of Schottky-type barrier heights according to embodiments of the disclosure.
Figure 6B:
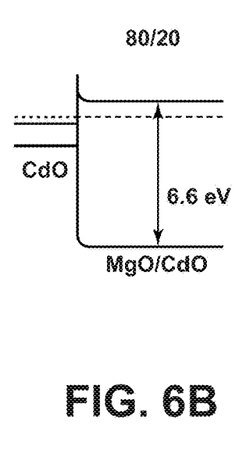
Figure 6C:
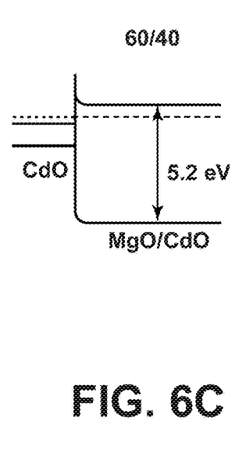
Figure 6D:
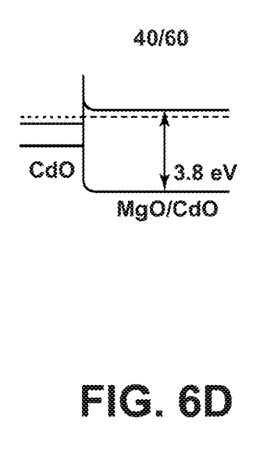
Figure 6E:
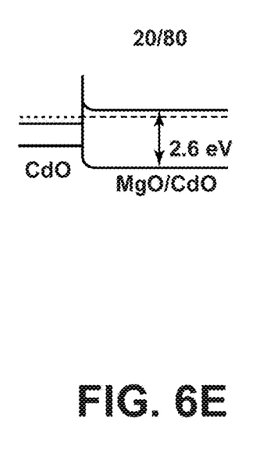

Additionally, the solid CdMgO solution of the semiconductor side 115 of the heterojunction 105 allows for the tailoring of the band structure of the CdMgO. By tailoring the band structure of CdMgO, the height of the Schottky-type barrier can be tuned. The barrier height is tuned by adjusting the relative ratios of Cd and Mg in CdMgO. Adjusting the relative ratios of Cd and Mg in CdMgO also modifies the properties of the semiconductor side 115, which affects the performance of the detector. For example, Cd and Mg can have an "X" and "1−X" relationship (e.g., "$Cd_xMg_{1-x}O$"). FIGS. 6A, 6B, 6C, 6D, and 6E illustrate the concept of tuning the barrier height of the heterojunction 105. In FIG. 6A, a relatively large barrier exists between the metal side 110 and the semiconductor side 115 of the heterojunction 105. The semiconductor side 115 (i.e., MgO) has a bandgap of about 8 eV. As the ratio of CdO is increased, the barrier height decreases and the bandgap of the semiconductor decreases. For example, in FIG. 6B, a smaller barrier exists between the metal side 110 and the semiconductor side 115 of the heterojunction 105. The semiconductor side 115 (i.e., $Cd_{0.2}Mg_{0.8}O$) has a bandgap of about 6.6 eV. In FIG. 6C, the barrier between the metal side 110 and the semiconductor side 115 of the heterojunction 105 continues to become smaller. The semiconductor side 115 (i.e., $Cd_{0.4}Mg_{0.6}O$) has a bandgap of about 5.2 eV. In FIG. 6D, the barrier height again decreases and the semiconductor side 115 (i.e., $Cd_{0.6}Mg_{0.4}O$) has a bandgap of about 3.8 eV. In FIG. 6E, the barrier height further decreases and the semiconductor side 115 (i.e., $Cd_{0.8}Mg_{0.2}O$) has a bandgap of about 2.6 eV. In some embodiments, Cd and Mg can have relative concentrations that can each vary from any value between zero and one. By increasing the Mg content of CdMgO, the bandgap of the resulting crystal increases. Increasing the bandgap of CdMgO, in turn, changes the electron affinity of the CdMgO material. The height of a Schottky-type barrier is generally defined by the difference of the metal work function and the semiconductor electron affinity. By increasing the bandgap of CdMgO, the electron affinity in CdMgO is decreased, which results in an increased Schottky-type barrier height. Thus, the Schottky-type barrier height of the heterojunction 105 can be fine-tuned for optimal performance for a given range of detected wavelengths.

Figure 7:
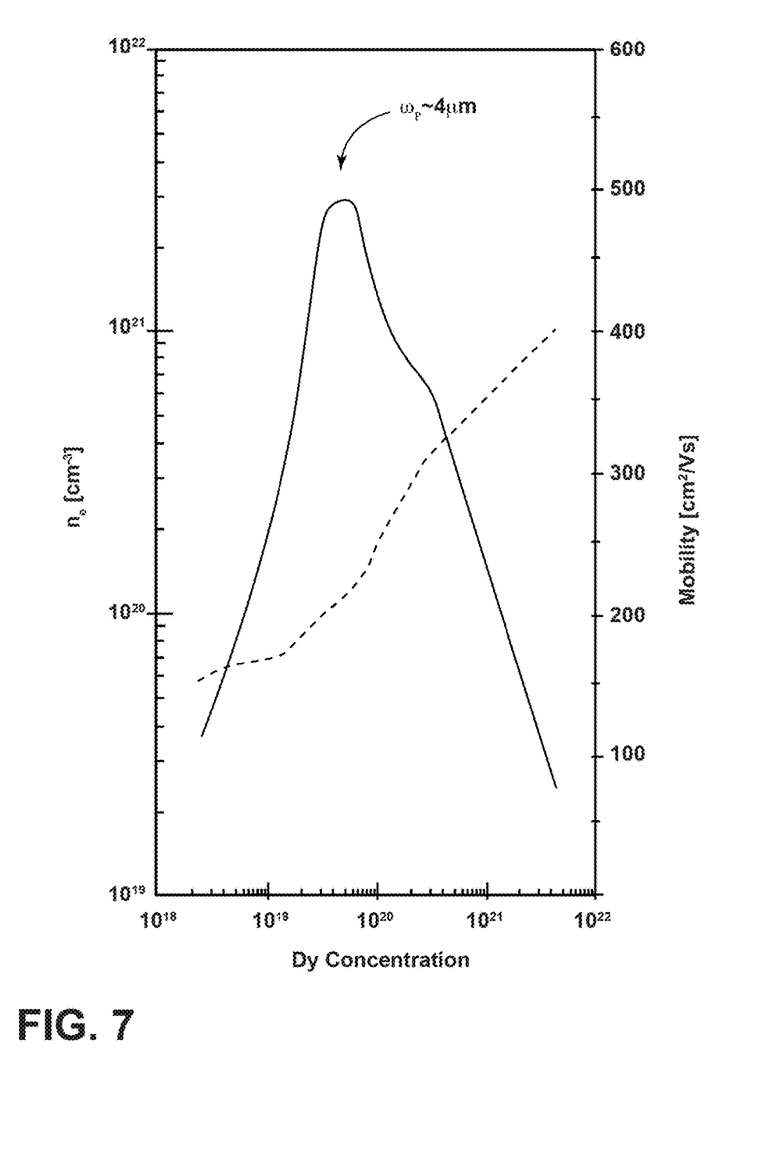
FIG. 7 illustrates carrier concentration and mobility for an oxide semiconductor according to an embodiment of the disclosure.

In addition to fine-tuning the Schottky-type barrier height of the heterojunction 105 as described above, the wavelengths of radiation that the detector 100 detects can be tuned by altering the metal side 110 of the heterojunction 105. For example, the wavelength of radiation that is detected by the detector 100 can be controlled by controlling the carrier concentration of the CdO:Dy material. The carrier concentration of CdO:Dy is controlled by varying the Dy concentration of the CdO:Dy material. The electrical properties of CdO:Dy are shown in FIG. 7 with respect to the Dy concentration of the CdO:Dy material. The electron mobility value for CdO:Dy between 200 $cm^2/V \cdot s$ and 500 $cm^2/V \cdot s$ is achieved at carrier concentrations between $10^{19}$/cc and $10^{20}$/cc, which couple to infrared radiation. This is a unique feature of CdO:Dy that is not found in other oxide materials at room temperature.

CdO:Dy also has other advantages in the context of conventional metal plasmonics. For example, CdO:Dy behaves similar to an ideal Drude conductor. As a result, plasmonic losses are either very small, or more hot electrons are generated and signals have a greater magnitude. Also, the carrier mobility for optimized CdO:Dy is approximately five times greater than that of Au. The high carrier mobility translates to longer hot electron lifetimes and substantially more electrons can be collected. Finally, CdO:Dy can be grown epitaxially on a variety of semiconductors, which enables tunable interface properties.

In some embodiments, the heterostructures described herein are used, for example, to allow solar cells to harvest infrared radiation that is part of the solar emission spectrum. Infrared radiation is currently not accessible for silicon ("Si") based photovoltaic devices (i.e., for energies less than the 1.1 eV bandgap of Si).

Figure 8:
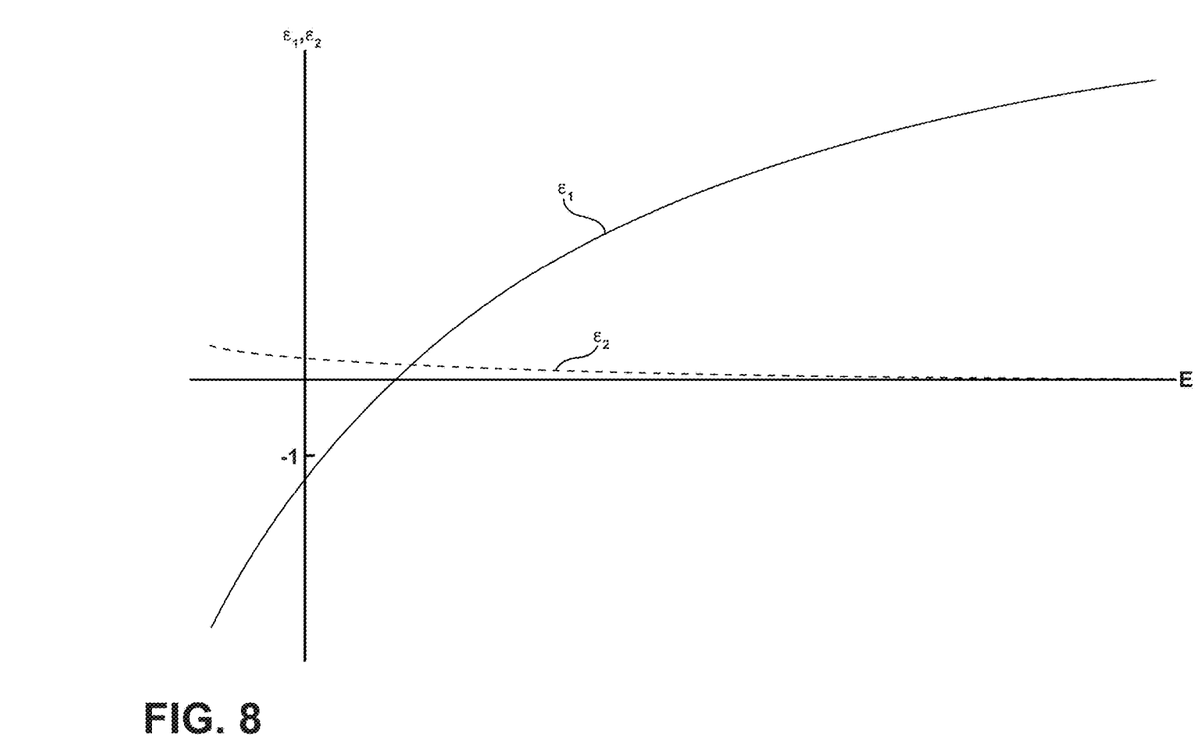
FIG. 8 illustrates dielectric constant for an oxide according to an embodiment of the disclosure.

A dielectric constant function of CdO is shown in FIG. 8 with respect to energy E. In FIG. 8, $\varepsilon_1$ is the real part and $\varepsilon_2$ is the imaginary part of the dielectric constant function. In FIG. 8, $\varepsilon_1$ crosses over from positive to negative as energy decreases. Plasmonic phenomena are generally supported at energies where $\varepsilon_1$ is less than −1. At energies greater than that, CdO transitions from metallic optical behavior to dielectric optical behavior at the energy corresponding to $\varepsilon_1$ equals zero. In other words, the real part of the dielectric constant exhibits a crossover point in which it transitions from a positive value (i.e., dielectric behavior) to a negative value (i.e., metallic behavior).

Figure 9:
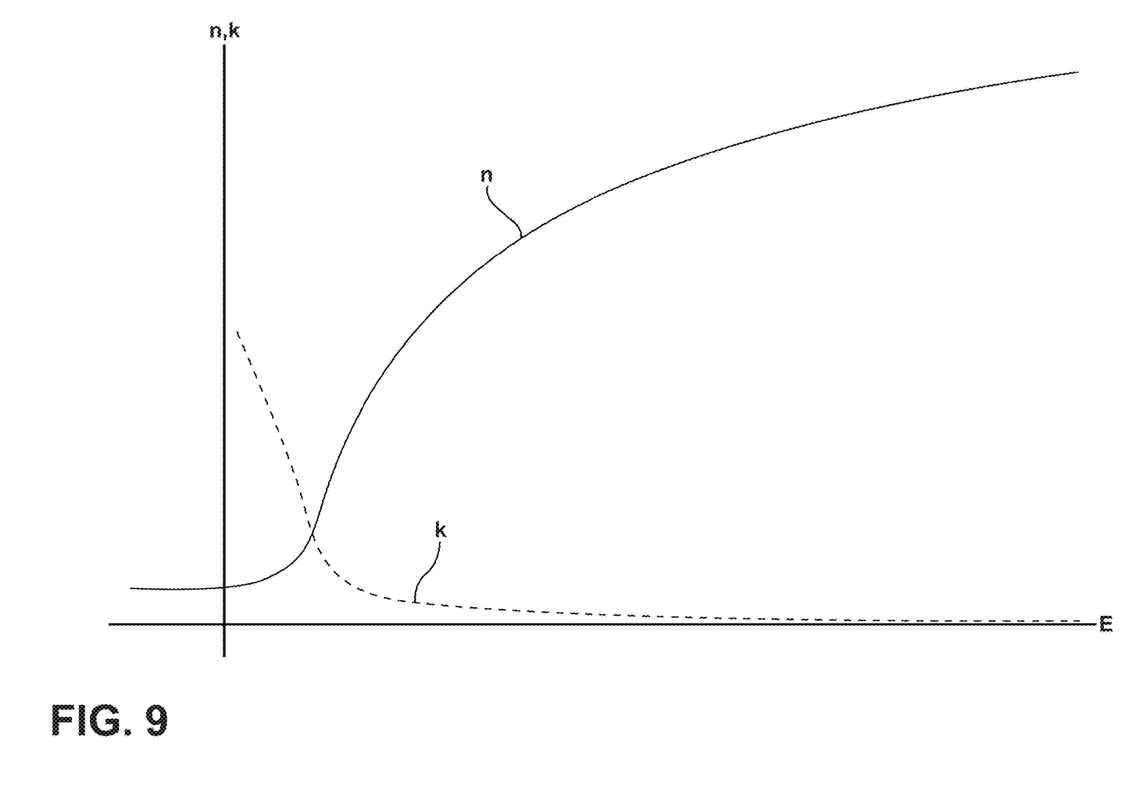
FIG. 9 illustrates refractive index and absorption for an oxide according to an embodiment of the disclosure.

Optical properties of CdO are shown in FIG. 9 with respect to energy E. In FIG. 9, n is the refractive index and k is absorption of CdO:Dy. A transition from dielectric to metallic optical behavior is represented in FIG. 9 as a transition from a high refractive index with low loss (dielectric) at high energies, to a low refractive index with high loss (metallic optical) at low energies. At this transition (or crossover) point, CdO:Dy transitions from a mirror to a transparent dielectric whilst maintaining the high conductivities inherent to CdO:Dy. Thus, CdO:Dy may be used as a conductive optical high pass filter.

As described above, the optical properties of CdO follow the ideal Drude model for conductors. The Drude model description of the dielectric function for a conductor may be summarized using the following equations:

$$\varepsilon = \varepsilon_\infty + (\omega_p^2/((\omega \times \gamma \times i) \times \omega^2)) \quad (1)$$

wherein,
  $\varepsilon$=dielectric constant,
  $\varepsilon_\infty$=high frequency dielectric constant, and
  $\gamma$=damping.

$$\gamma = q/(\mu \times m_e) \quad (2)$$

wherein,
  $\mu$=free carrier mobility.

Figure 10A:
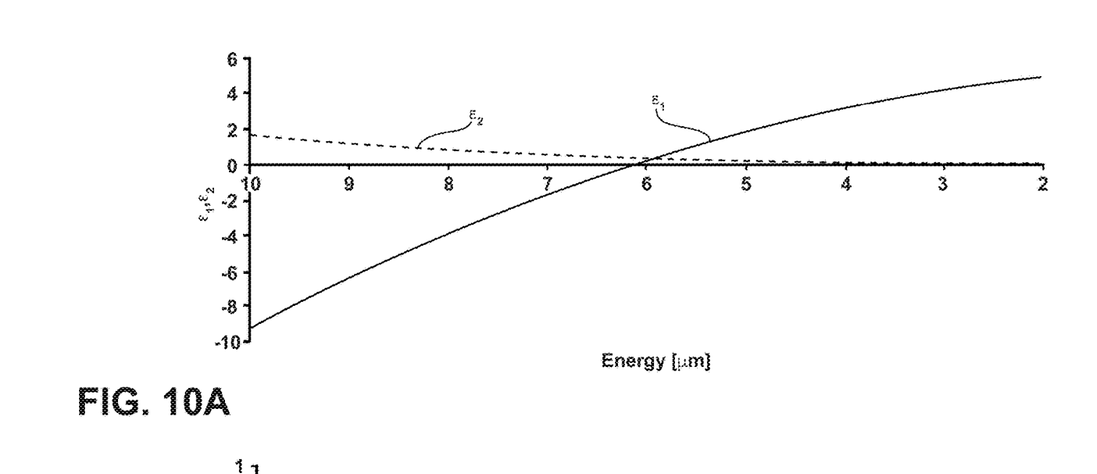
FIG. 10A illustrates dielectric constant for an oxide according to an embodiment of the disclosure.
Figure 10B:
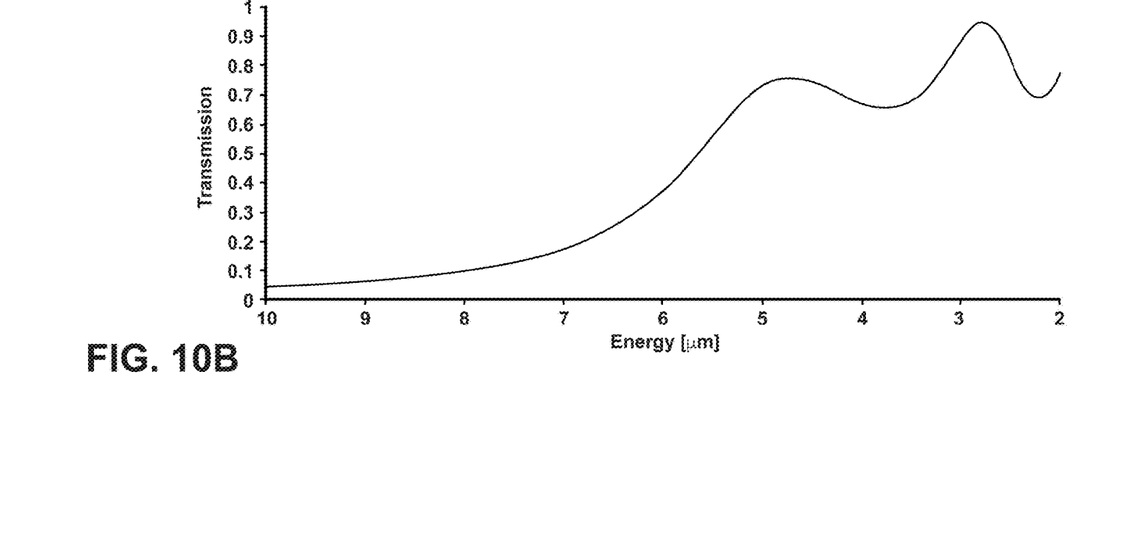
FIG. 10B illustrates transmission for an oxide according to an embodiment of the disclosure.

A dielectric constant function for CdO is shown in FIG. 10A with respect to energy for an optically thick film (e.g., >300 nm) on an IR transparent Si substrate. A transmission of CdO at normal incident angles is shown in FIG. 10B with respect to energy for the optically thick film on the IR transparent Si substrate. In some embodiments, the IR transparent substrate includes Si. In other embodiments, the IR transparent substrate may include germanium ("Ge"), MgO, sapphire, GaN, zinc selenide ("ZnSe"), and calcium fluoride ("CaF$_2$"). In FIGS. 10A and 10B, the data is plotted in wavelength and the plotted range is in the infrared.

In FIG. 10B, the transmission drops to below 20% for energies greater than 6.5 µm wavelength and to almost zero at lower energies. At the crossover point of $\varepsilon_1$ in FIG. 10A, CdO:Dy transitions from a dielectric (high transmission, with thickness fringing), to a mirror (low transmission). The fringing at energies greater than 5 µm wavelength (i.e., smaller wavelengths) is due to interference effects within the transparent layer. The crossover point of $\varepsilon_1$ defines a filter cutoff. In other words, CdO:Dy reflects IR radiation with wavelengths above a filter cutoff and transmits IR radiation with wavelengths below the filter cutoff. The filter cutoff is based on the carrier concentration (e.g., the concentration of dysprosium in the CdO:Dy). The transition from transmission to reflection (i.e., the filter cutoff) may be tuned over a wide range in the infrared spectrum due to the tunability of carrier concentration within CdO:Dy.

Figure 11:
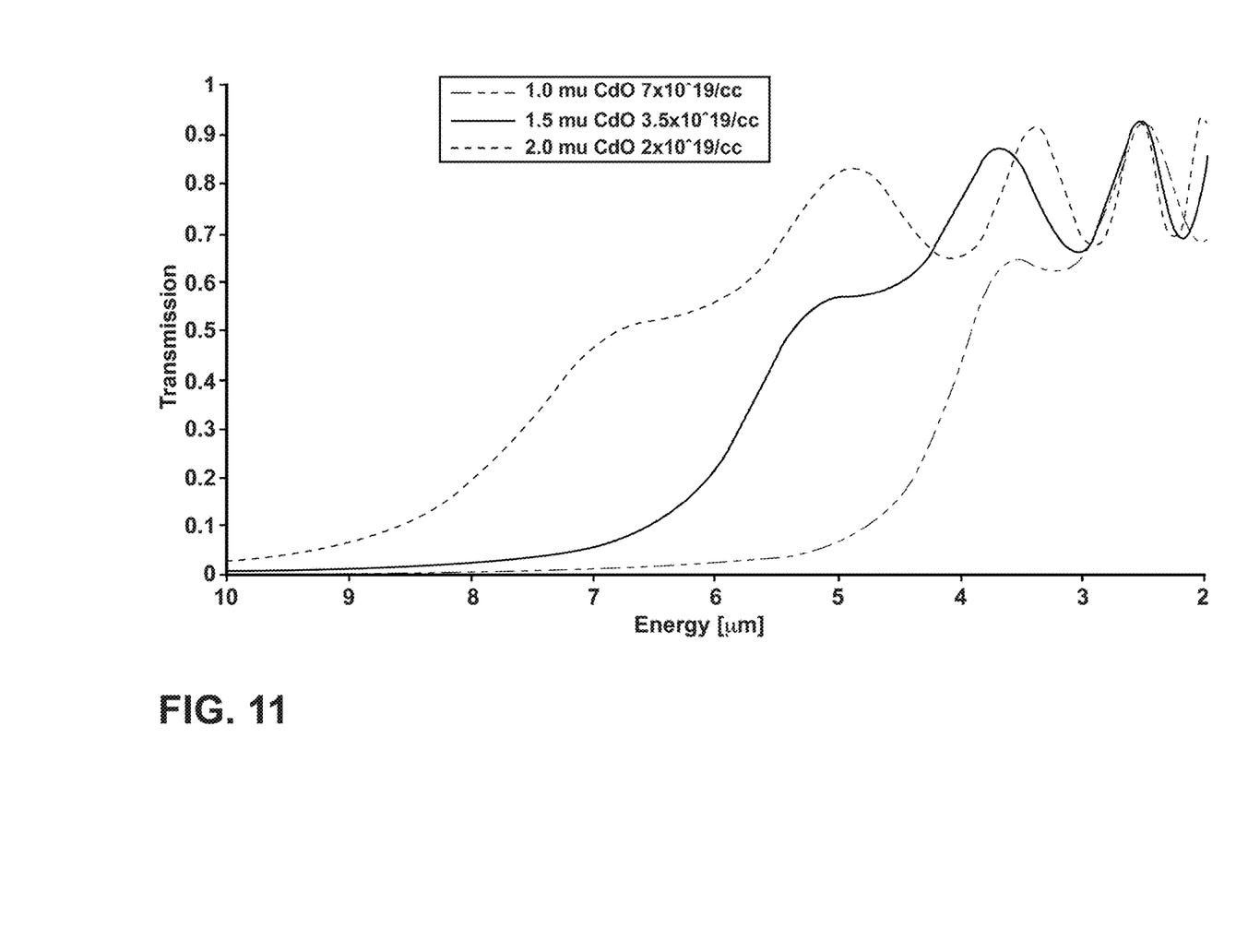
FIG. 11 illustrates transmissions for three oxides according to an embodiment of the disclosure.

The transmissions for three different doping levels of CdO:Dy are shown in FIG. 11. The three different doping levels (e.g., carrier concentrations) in FIG. 11 illustrate tuning the filter cutoff from 4 µm to 8 µm wavelength. The filter cutoff for each of the three doping levels is different. The filter cutoff is directly proportional to the carrier concentration in CdO:Dy. The filter cutoff decreases as the carrier concentration of CdO:Dy increases. The limits of the filter cutoff generally correspond to the lowest doping level of approximately $9.5 \times 10^{18}$/cc and the highest doping level of approximately $3 \times 10^{20}$/cc. This generally corresponds to a filter cutoff frequency of 11.8 µm to 2 µm wavelength when using the entire accessible doping range of CdO. The filter cutoff may be tuned whilst maintaining high DC conductivities in the CdO layer. The relationship between carrier concentration and conductivity throughout the doping series is illustrated numerically in Table #1 below.

TABLE #1

Conductivity for Cdo Based on Carrier Concentration

| Carrier Conc. cm$^{-3}$ | Mobility cm$^2$/Vs | Resistivity ohm cm | Conductivity S/cm |
|---|---|---|---|
| 9.5E+19 | 115 | 3.90E−04 | 2.51E+03 |
| 6.77E+19 | 194 | 3.50E−04 | 2.86E+03 |
| 7.15E+19 | 290 | 1.30E−04 | 7.69E+03 |
| 9.94E+19 | 474 | 1.00E−04 | 1.00E+04 |
| 1.14E+20 | 491 | 9.40E−05 | 1.06E+04 |
| 1.28E+20 | 485 | 1.00E−04 | 1.00E+04 |
| 1.74E+20 | 420 | 7.24E−05 | 1.38E+04 |
| 2.32E+20 | 395 | 5.90E−05 | 1.69E+04 |
| 3.70E+20 | 359 | 7.00E−05 | 1.43E+04 |

CdO:Dy may be used as a top-contact for infrared optics, sensors, filters or active optical elements that require an IR transparent top electrode. Some transparent conductive oxides used for visible and near-IR light applications, such as ITO, ZnO:Ga, and ZnO:Al, do not include a controlled tunability of the filter cutoff.

In some embodiments, the CdO is alloyed with calcium Ca. The filter cutoff may be increased by alloying the CdO with Ca, such that $Cd_xCa_{1-x}O$ with x>0.9. The carrier concentration in CdO decreases as the Ca content increases. Alloying CdO with Ca enables higher filter cutoffs (e.g., ≥16 µm wavelength).

Thus, the disclosure provides, among other things, an all-oxide heterojunction for the detection of infrared radiation at room temperature. Various features and advantages of the disclosure are set forth in the following claims.

What is claimed is:

1. A detector for detecting infrared radiation, the detector comprising:
    a first portion formed of a cadmium oxide doped with dysprosium;
    a second portion formed of a semiconducting material; and
    a heterojunction between the first portion and the second portion, the heterojunction forming a Schottky-type barrier.

2. The detector of claim 1, wherein the detector is uncooled.

3. The detector of claim 1, wherein the first portion of the detector reflects infrared radiation when a wavelength of the infrared radiation is below a filter cutoff.

4. The detector of claim 3, wherein the filter cutoff is based on a concentration of dysprosium in the cadmium oxide.

5. The detector of claim 1, wherein the cadmium oxide is doped with a metal having a valence state of $^{+3}$.

6. The detector of claim 1, wherein the cadmium oxide is alloyed with calcium.

7. The detector of claim 6, wherein a wavelength of infrared radiation incident upon the first portion creates hot carriers and is controlled based on a concentration of calcium in the conducting metal oxide.

8. The detector of claim 1, wherein infrared radiation incident upon the first portion of the detector has a wavelength between 1.5 micrometers and 12 micrometers.

9. The detector of claim 1, wherein the detector is operable at temperatures between 50° F. and 90° F.

10. The detector of claim 1, wherein the semiconducting material is cadmium magnesium oxide.

11. A detector for detecting infrared radiation, the detector comprising:
a first portion formed of a conducting metal oxide, wherein the conducting metal oxide is cadmium oxide;
a second portion formed of a semiconducting material; and
a junction between the first portion and the second portion, the junction forming a Schottky-type barrier,
wherein the semiconducting material is cadmium magnesium oxide,
wherein a height of the Schottky-type barrier is controlled based on a relative ratio of cadmium to magnesium in the cadmium magnesium oxide.

12. The detector of claim 11, wherein the cadmium oxide is doped with dysprosium.

13. The detector of claim 12, wherein a wavelength of infrared radiation that creates the hot carriers is controlled based on a concentration of dysprosium in the conducting metal oxide.

14. The detector of claim 12, wherein the first portion of the detector reflects infrared radiation when a wavelength of the infrared radiation is below a filter cutoff.

15. The detector of claim 14, wherein the filter cutoff is based on a concentration of dysprosium in the conducting metal oxide.

16. The detector of claim 11, wherein the detector is uncooled.

17. The detector of claim 11, wherein the first portion is configured to convert incident infrared radiation within a predetermined wavelength range into hot carriers, and wherein the hot carriers are injected from a conduction band of the conducting metal oxide across the junction to a conduction band of the semiconducting material.

18. A detector for detecting infrared radiation, the detector comprising:
a first portion formed of a conducting metal oxide;
a second portion formed of a semiconducting material; and
a junction between the first portion and the second portion, the junction forming a Schottky-type barrier,
wherein the detector is operable at temperatures between 50° F. and 90° F.,
wherein an electron mobility of the conducting metal oxide is greater than about 200 $cm^2/V \cdot s$, and
wherein the electron mobility of the conducting metal oxide is between about 200 $cm^2/V \cdot s$ and 500 $cm^2/V \cdot s$.

19. The detector of claim 18, wherein the first portion is configured to convert incident infrared radiation within a predetermined wavelength range into hot carriers, and wherein the hot carriers are injected from a conduction band of the conducting metal oxide across the junction to a conduction band of the semiconducting material.

* * * * *